United States Patent
Lee et al.

(10) Patent No.: US 10,672,810 B2
(45) Date of Patent: Jun. 2, 2020

(54) CMOS IMAGE SENSOR WITH SHALLOW TRENCH EDGE DOPING

(71) Applicant: Taiwan Semiconductor Manufacturing Co., Ltd., Hsin-Chu (TW)

(72) Inventors: Yueh-Chuan Lee, Hsinchu (TW); Chia-Chan Chen, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/935,437

(22) Filed: Mar. 26, 2018

(65) Prior Publication Data

US 2019/0131331 A1 May 2, 2019

Related U.S. Application Data

(60) Provisional application No. 62/579,488, filed on Oct. 31, 2017.

(51) Int. Cl.
*H01L 31/062* (2012.01)
*H01L 27/146* (2006.01)
*H01L 21/02* (2006.01)
*H01L 29/06* (2006.01)

(52) U.S. Cl.
CPC .... *H01L 27/14612* (2013.01); *H01L 21/0257* (2013.01); *H01L 27/1461* (2013.01); *H01L 27/1463* (2013.01); *H01L 27/14689* (2013.01); *H01L 29/0638* (2013.01)

(58) Field of Classification Search
CPC .................................................. H01L 27/14612
USPC .......................................................... 257/292
See application file for complete search history.

(56) References Cited

U.S. PATENT DOCUMENTS

| 9,318,630 | B2 | 4/2016 | Lee et al. | |
| 2007/0057147 | A1 | 3/2007 | Kim | |
| 2012/0083066 | A1* | 4/2012 | Kim | H01L 27/14601 438/73 |
| 2012/0319230 | A1 | 12/2012 | Liu et al. | |
| 2013/0234202 | A1 | 9/2013 | JangJian et al. | |
| 2014/0015026 | A1* | 1/2014 | Ahn | H01L 27/14643 257/292 |

FOREIGN PATENT DOCUMENTS

| CN | 104167419 A | 11/2014 |
| TW | 201225268 A | 6/2012 |

* cited by examiner

*Primary Examiner* — Ajay Arora
(74) *Attorney, Agent, or Firm* — Eschweiler & Potashnik, LLC

(57) ABSTRACT

In some embodiments, the present disclosure relates to an integrated chip having a photodetector arranged within a semiconductor substrate having a first doping type. One or more dielectric materials are disposed within a trench defined by interior surfaces of the semiconductor substrate. A doped epitaxial material arranged within the trench at a location laterally between the one or more dielectric materials and the photodetector. The doped epitaxial material has a second doping type that is different than the first doping type.

20 Claims, 9 Drawing Sheets

CMOS IMAGE SENSOR WITH SHALLOW TRENCH EDGE DOPING

REFERENCE TO RELATED APPLICATION

This Application claims priority to U.S. Provisional Application No. 62/579,488 filed on Oct. 31, 2017, the contents of which are hereby incorporated by reference in their entirety.

BACKGROUND

Integrated circuits (ICs) with image sensors are used in a wide range of modern day electronic devices, such as, for example, cell phones and medical imaging equipment. In recent years, complementary metal-oxide semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
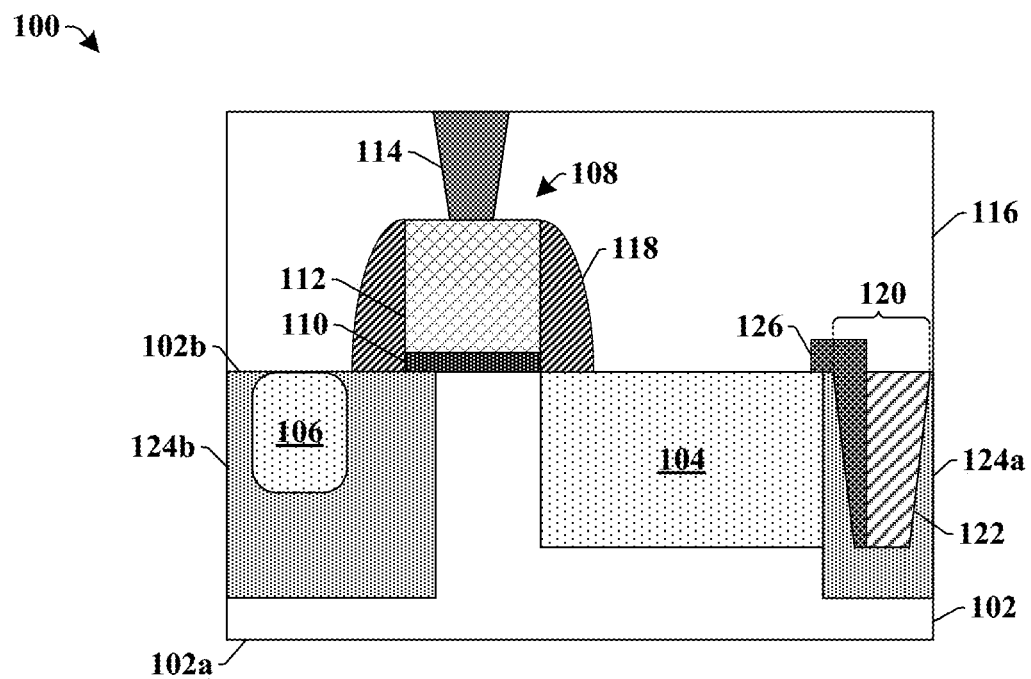
FIG. 1 illustrates a cross-sectional view of some embodiments of an integrated image sensor having one or more dielectric materials and a doped epitaxial material arranged within a trench in a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated image sensor typically contains large arrays of pixel regions respectively comprising a photodetector disposed within the semiconductor substrate. The pixel regions are electrically isolated from one another by isolation structures (e.g., shallow trench isolation structures) disposed within trenches in the semiconductor substrate. During fabrication of the isolation structures, the semiconductor structure is etched to form a trench, which is subsequently filled with one or more dielectric materials. The etching processes used to form the trench can damage the semiconductor substrate, resulting in defects (e.g., dangling bonds, etc.) along interior surfaces of the semiconductor substrate defining the trench. The defects may trap charge carriers (e.g., electrons) and cause an unwanted leakage current to flow between adjacent pixel regions, leading to dark current and white pixel issues within the integrated image sensor.

To prevent the unwanted leakage current between adjacent pixel regions, an implantation process may be performed to form a well region along edges of the trench. The well region is selected to have a doping type that prevents the movement of charge carriers towards the trench, thereby mitigating the leakage current. However, such an implantation process is also used to concurrently form an additional well region extending under a channel region of a transfer transistor within the pixel region (e.g., to tune a threshold voltage of the transfer transistor). If the implantation process is performed with a high doping concentration, the unwanted leakage current can be mitigated, but an image lag of the transfer transistor is increased. Alternatively, if the implantation process is performed with a low doping concentration, the image lag of the transfer transistor can be improved but the unwanted leakage current is worse.

The present disclosure, in some embodiments, relates to an integrated image sensor configured to provide for both low image lag and leakage currents. The integrated image sensor comprises a photodetector arranged within a semiconductor substrate and separated from a trench within the substrate by a first well region. An isolation structure comprising one or more dielectric materials is disposed within the trench. A doped epitaxial material is also arranged within the trench at a location laterally between the one or more dielectric materials and the first well region. The doped epitaxial material has a first doping concentration that is configured to increase a doping concentration of the first well region. By increasing a doping concentration of the first well region isolation between the photodetector and the trench is increased and unwanted leakage currents between adjacent pixel regions are reduced. Furthermore, a second well region under a transfer transistor can be selected to have a second doping concentration that is less than the first doping concentration so as to mitigate image lag.

FIG. 1 illustrates a cross-sectional view of some embodiments of an integrated image sensor 100 having one or more dielectric materials and a doped epitaxial material arranged within a trench in a substrate.

The integrated image sensor 100 comprises a photodetector 104 disposed within a substrate 102. In some embodiments, the photodetector 104 may comprise a photodiode (e.g., a pinned photodiode). In such embodiments, the photodetector 104 has a first doped region having a first doping type (e.g., an n-type doping) and an overlying second doped region having a second doping type (e.g., a p-type doping). In some embodiments, the first and second doped regions may both be disposed within the substrate 102. In other embodiments, the first doped region may be disposed within the substrate 102 and the second doped region may comprise an epitaxial layer overlying the substrate 102. In some embodiments, the integrated image sensor 100 may comprise a front-side illuminated (FSI) image sensor, which is configured to receive incident radiation along a first surface 102a (i.e., a front-side) of the substrate 102 prior to the radiation reaching a second surface 102b (i.e., a back-side) of the substrate 102. In other embodiments, the integrated image sensor 100 may comprise a back-side illuminated (BSI) image sensor, which is configured to receive incident radiation along the second surface 102b prior to the radiation reaching the first surface 102a.

A gate structure 108 is disposed over the substrate 102 at a location between the photodetector 104 and a floating diffusion region 106 within the substrate 102. The gate structure 108 comprises a conductive gate material 112 separated from the substrate 102 by a gate dielectric layer 110. In some embodiments, the conductive gate material 112 may be flanked by sidewall spacers 118. The floating diffusion region 106 comprises a doped region having the first doping type (e.g., the n-type doping). A conductive contact 114 is arranged over the gate structure 108. The conductive contact 114 is surrounded by a dielectric structure 116 (e.g., an inter-level dielectric (ILD) layer) over the substrate 102.

The substrate 102 comprises interior surfaces (e.g., sidewalls and a lower surface) defining a trench 120 disposed within the first surface 102a of the substrate 102. In some embodiments, the trench 120 may be arranged within a first well region 124a within the substrate 102 and the floating diffusion region 106 may be arranged within a second well region 124b within the substrate 102. The first well region 124a and the second well region 124b have the second doping type (e.g., the p-type doping). In some embodiments, a second well region 124b may extend from around the floating diffusion region 106 to below the gate structure 108. By having the second well region 124b extend to below the gate structure 108, the second well region 124b can be used to tune a threshold voltage of the gate structure 108.

One or more dielectric materials 122 are disposed within the trench 120. In various embodiments, the one or more dielectric materials 122 may comprise an oxide, a nitride, or the like. A doped material having the second doping type (e.g., a p-type doping) is also disposed within the trench 120. In some embodiments, the doped material may comprise a doped epitaxial material 126 disposed within the trench 120, while in other embodiments the doped material may be formed by non-epitaxial methods. The doped epitaxial material 126 is arranged along sidewalls of the substrate 102 that define the trench 120. In some embodiments, a first side of the doped epitaxial material 126 laterally contacts a sidewall of the substrate 102 and a second side of the doped epitaxial material 126 laterally contacts the one or more dielectric materials 122 within the trench 120. In some embodiments, the doped epitaxial material 126 protrudes outward from the trench 120 to over the substrate 102.

The doped epitaxial material 126 has a larger doping concentration than that of the first well region 124a and/or the second well region 124b. For example, in some embodiments, the first well region 124a and the second well region 124b may have a doping concentration that is in a range of between approximately $1 \times 10^{15}$ atoms/cm$^3$ and approximately $1 \times 10^{17}$ atoms/cm$^3$, while the doped epitaxial material 126 may have a doping concentration that is greater than approximately $1 \times 10^{17}$ atoms/cm$^3$. The higher doping concentration of the doped epitaxial material 126 causes the first well region 124a to have a doping concentration that is higher between the trench 120 and photodetector 104 than a doping concentration of the second well region 124b below the gate structure 108. This is because the higher doping concentration of the doped epitaxial material 126 causes dopants from the doped epitaxial material 126 to diffuse into the surrounding regions of the first well region 124a, thereby increasing a doping concentration of first well region 124a near the trench 120 without increasing a doping concentration of the second well region 124b below the gate structure 108.

The higher doping concentration of the first well region 124a near the trench 120 reduces leakage currents between adjacent pixel regions by increasing isolation between the photodetector 104 and the trench 120 and/or by neutralizing charge carriers (e.g., electrons) trapped by defects formed along the interior surfaces of the trench 120 during etching of the substrate 102. The lower doping concentration of the second well region 124b below the gate structure 108 decreases a threshold voltage and an associated image lag of the gate structure 108. Therefore, the doped epitaxial material 126 is able to improve performance of the integrated image sensor 100 by mitigating leakage currents while improving an image lag of the gate structure 108.

Figure 2:
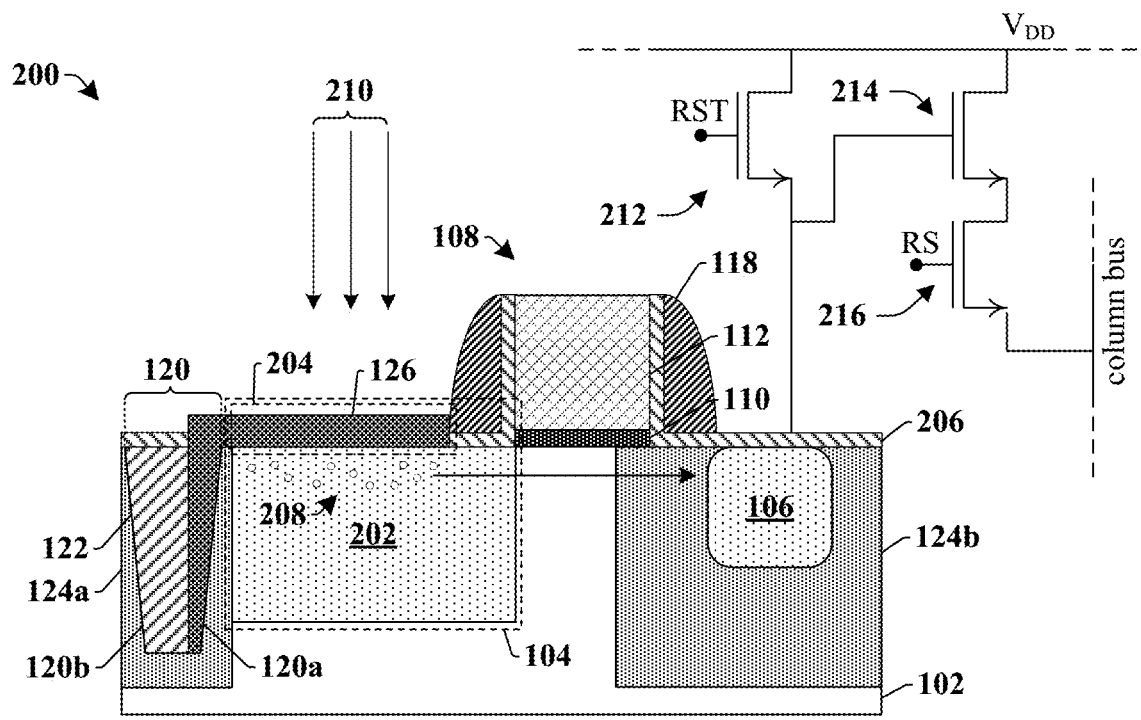
FIG. 2 illustrates a cross-sectional view of some additional embodiments of an integrated image sensor having one or more dielectric materials and a doped epitaxial material arranged within a trench in a substrate.

FIG. 2 illustrates a cross-sectional view of some additional embodiments of an integrated image sensor 200 having one or more dielectric materials and a doped epitaxial material arranged within a trench in a substrate.

The integrated image sensor 200 comprises a photodetector 104 disposed within a substrate 102. In some embodiments, the photodetector 104 comprises a photodiode having a first photodiode region 202 and an overlying second photodiode region 204. The first photodiode region 202 is a doped region disposed within the substrate 102 and having an uppermost surface that is arranged along an upper surface of the substrate 102 (e.g., that is substantially co-planar with the upper surface of the substrate 102). The second photodiode region 204 is comprised within a doped epitaxial material 126 arranged over the upper surface of the substrate 102.

The photodetector 104 is laterally separated from a floating diffusion region 106 arranged within the substrate 102. In some embodiments, the first photodiode region 202 may have a first doping type (e.g., an n-type doping), the second photodiode region 204 may have a second doping type (e.g., a p-type doping) different than the first doping type, the substrate 102 may have the first doping type (e.g., the n-type doping), and the floating diffusion region 106 may have the first doping type (e.g., the n-type doping). In some embodiments, the photodetector 104 abuts a first well region 124a having the second doping type (e.g., the p-type doping) and the floating diffusion region 106 is surrounded by a second well region 124b having the second doping type (e.g., the p-type doping). The second well region 124b may continuously extend from around the floating diffusion region 106 to below the gate structure 108.

A gate structure 108 is disposed over the substrate 102 at a location between the photodetector 104 and the floating diffusion region 106. The gate structure 108 comprises a conductive gate material 112 separated from the substrate 102 by a gate dielectric layer 110. A dielectric protection layer 206 extends along opposing sides of the conductive gate material 112 and over the substrate 102. In some embodiments, sidewall spacers 118 are arranged over the dielectric protection layer 206 along the opposing sides of the conductive gate material 112.

In some embodiments, the conductive gate material 112 comprises polysilicon. In such embodiments, the gate dielectric layer 110 may include a dielectric material, such as an oxide (e.g., silicon dioxide), a nitride (e.g., silicon-nitride), or the like. In other embodiments, the conductive gate material 112 may comprise a metal, such as aluminum, copper, titanium, tantalum, tungsten, molybdenum, cobalt, or the like. In such embodiments, the gate dielectric layer 110 may comprise a high-k dielectric material, such as hafnium oxide, hafnium silicon oxide, hafnium tantalum oxide, aluminum oxide, zirconium oxide, or the like. In some embodiments, the dielectric protection layer 206 may comprise an oxide (e.g., silicon dioxide), a nitride (e.g., silicon-nitride), or the like. In some embodiments, the sidewall spacers 118 may comprise an oxide, a nitride, a carbide, or the like.

The substrate 102 has interior surfaces that define a trench 120 arranged within the first well region 124a. One or more dielectric materials 122 (e.g., an oxide, a nitride, or the like) are disposed within the trench 120. The doped epitaxial material 126 is also disposed within the trench 120. The doped epitaxial material 126 has the second doping type (e.g., the p-type doping) with a higher doping concentration than that of the first well region 124a. In some embodiments, the doped epitaxial material 126 may comprise a semiconductor material, such as silicon (e.g., monocrystalline silicon or polysilicon), germanium, indium, or the like.

A first sidewall of the doped epitaxial material 126 laterally contacts the one or more dielectric materials 122 within the trench 120 and a second sidewall of the doped epitaxial material 126 laterally contacts a first sidewall 120a of the substrate 102 defining the trench 120. In some embodiments, the doped epitaxial material 126 is separated from a second sidewall 120b of the substrate 102 by the one or more dielectric materials 122. By lining the first sidewall 120a of the substrate 102 with the doped epitaxial material 126, a doping concentration of the first well region 124a can be increased near the trench 120, thereby increasing electrical isolation between the photodetector 104 and the trench 120 and reducing a leakage current between the photodetector 104 and an adjacent pixel region. In some embodiments, the first well region 124a may have a gradient doping concentration that increases (e.g., monotonically increases) from the first photodiode region 202 to the first sidewall 120a of the substrate 102 defining the trench 120. Furthermore, by separating the doped epitaxial material 126 from the second sidewall 120b, the one or more dielectric materials 122 are also able to provide electrical isolation between the photodetector 104 and the adjacent pixel region.

In some embodiments, the doped epitaxial material 126 continuously extends from within the trench 120 to above the first photodiode region 202. In other embodiments (not shown), the doped epitaxial material 126 within the trench 120 may be discontinuous from the doped epitaxial material 126 over the first photodiode region 202. In some embodiments, the dielectric protection layer 206 may have a sidewall that laterally contacts a sidewall of the doped epitaxial material 126. In some embodiments, the sidewall of the doped epitaxial material 126 may further contact the sidewall spacers 118.

Figure 5:
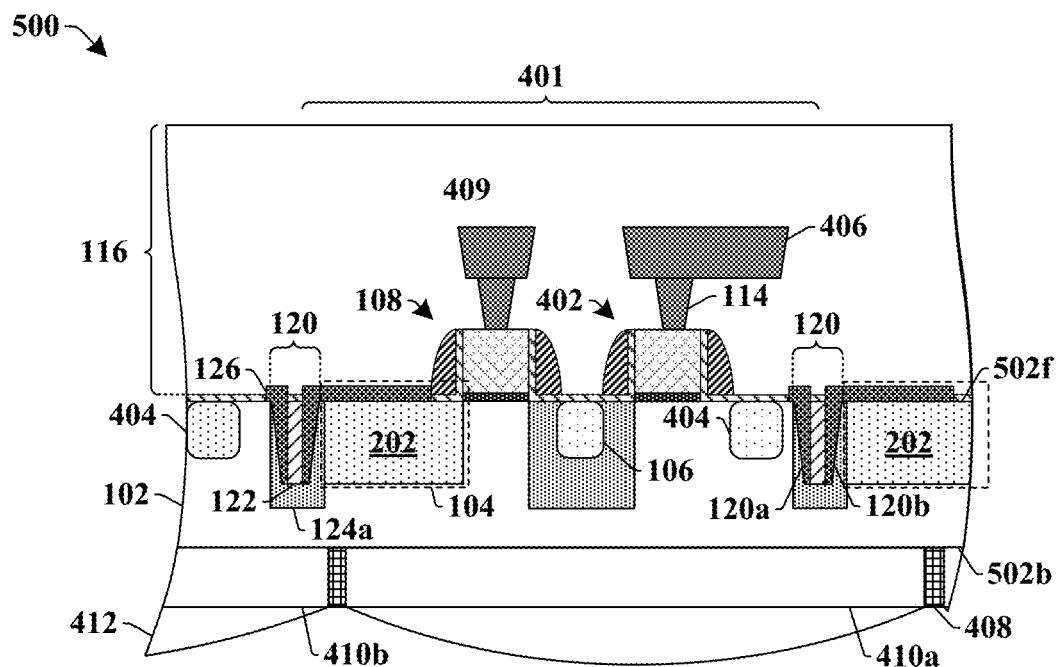
FIG. 5 illustrates a cross-sectional view of some additional alternative embodiments of an integrated image sensor having one or more dielectric materials and a doped epitaxial material arranged within a trench in a substrate.

During operation, electromagnetic radiation 210 (e.g., photons) striking the photodetector 104 generates charge carriers 208, which are collected in the first photodiode region 202. When the gate structure 108 (which is configured to operate as a transfer transistor) is turned on, the charge carriers 208 in the first photodiode region 202 are transferred to the floating diffusion region 106 as a result of a potential difference existing between the photodetector 104 and floating diffusion region 106. The charges are converted to voltage signals by a source-follower transistor 214. A row select transistor 216 is used for addressing. Prior to charge transfer, the floating diffusion region 106 is set to a predetermined low charge state by turning on a reset transistor 212, which causes electrons in the floating diffusion region 106 to flow into a voltage source ($V_{DD}$). Although the pixel region of FIG. 2 is described as having a transfer transistor disposed within the substrate 102 it will be appreciated that reset transistor 212, the source-follower transistor 214, and the row select transistor 216 may also be arranged within the substrate 102 (e.g., as shown in FIG. 5).

Figure 3:
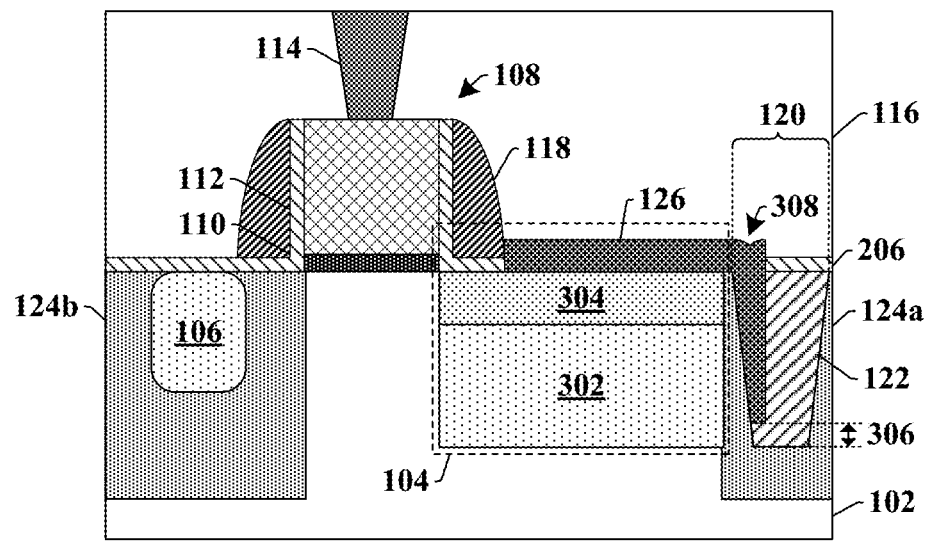
FIG. 3 illustrates a cross-sectional view of some alternative embodiments of an integrated image sensor having one or more dielectric materials and a doped epitaxial material arranged within a trench in a substrate.

FIG. 3 illustrates a cross-sectional view of some alternative embodiments of an integrated image sensor 300 having one or more dielectric materials and a doped epitaxial material arranged within a trench in a substrate.

The integrated image sensor 300 comprises a photodetector 104 disposed within a substrate 102 at a location laterally separated from a floating diffusion region 106 disposed within the substrate 102. The photodetector 104 comprises a photodiode having a first doped region 302 and a second doped region 304 both disposed within the substrate 102. In some embodiments, the first doped region 302 may have a first doping type (e.g., an n-type doping), the second doped region 304 may have a second doping type (e.g., a p-type doping) different than the first doping type, the substrate 102 may have the first doping type (e.g., the n-type doping), and the floating diffusion region 106 may have the first doping type (e.g., the n-type doping).

One or more dielectric materials 122 (e.g., an oxide, a nitride, or the like) are disposed within a trench 120 in the substrate 102. In some embodiments, the trench 120 may be arranged within a first well region 124a having the second doping type (e.g., the p-type doping). A doped epitaxial material 126 having the second doping type (e.g., the p-type doping) is disposed within the trench 120. In some embodiments, the upper surface of the doped epitaxial material 126 may comprise a divot 308 arranged over the trench 120.

In some embodiments, the doped epitaxial material 126 may have a bottommost surface that is separated from a bottom of the trench 120 by a non-zero distance 306. In such embodiments, the doped epitaxial material 126 may be laterally and vertically separated from the substrate 102 by the one or more dielectric materials 122 (e.g., the doped epitaxial material 126 may be separated from the substrate 102 by the one or more dielectric materials 122 along a first direction and along a second direction that is perpendicular to the first direction).

Figure 4A:
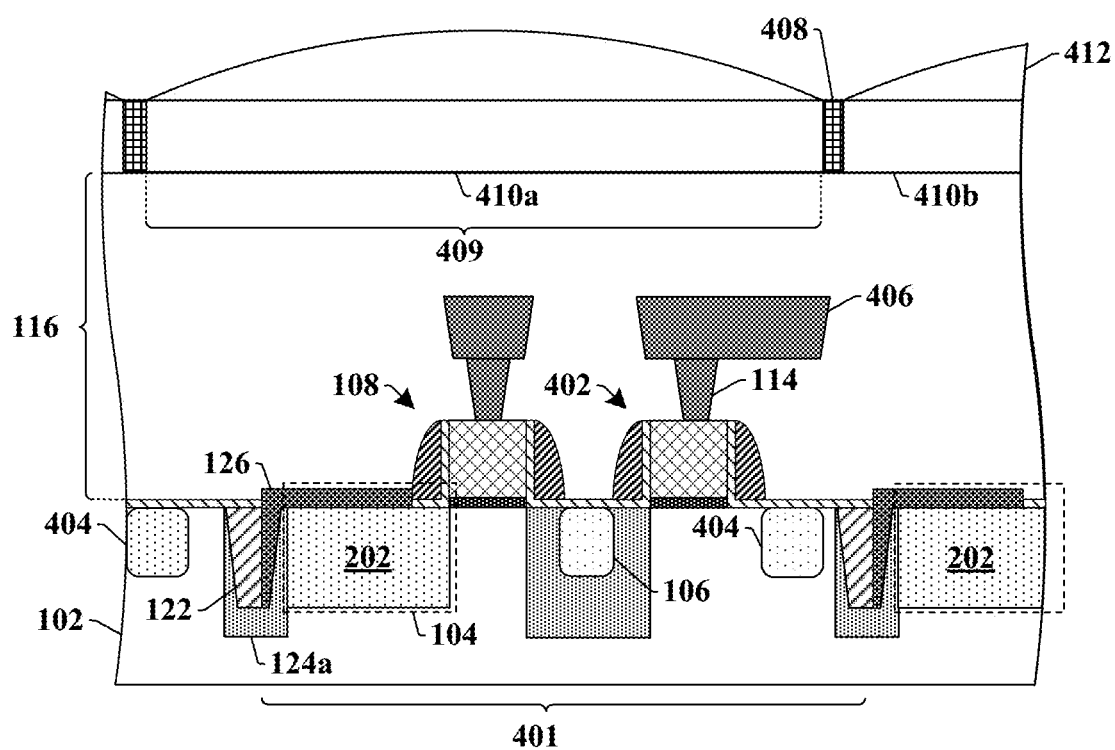
FIGS. 4A-4B illustrate some additional embodiments of an integrated image sensor having one or more dielectric materials and a doped epitaxial material arranged within a trench in a substrate.

FIG. 4A illustrates a cross-sectional view of some additional embodiments of an integrated image sensor 400 having one or more dielectric materials and a doped epitaxial material arranged within a trench in a substrate.

The integrated image sensor 400 comprises a pixel region 401 having a first gate structure 108 and a second gate structure 402 arranged over a substrate 102. The first gate structure 108 is associated with a transfer transistor arranged between a photodetector 104 and a floating diffusion region 106. The second gate structure 402 is associated with a reset transistor arranged between the floating diffusion region 106 and a source/drain region 404. Conductive contacts 114 are configured to connect the first gate structure 108 and the second gate structure 402 to one or more metal interconnect layers 406 arranged within a dielectric structure 116 comprising one or more stacked inter-level dielectric (ILD) layers disposed over the substrate 102.

A grid structure 408 is disposed over the dielectric structure 116. The grid structure 408 comprises sidewalls that define openings 409, which overlie pixel regions (e.g., pixel region 401) of the substrate 102. In various embodiments, the grid structure 408 may comprise a metal (e.g., aluminum, cobalt, copper, silver, gold, tungsten, etc.) and/or a dielectric material (e.g., $SiO_2$, SiN, etc.). A plurality of color filters 410a-410b are arranged within the openings 409 in the grid structure 408. The plurality of color filters 410a-410b are respectively configured to transmit specific wavelengths of incident radiation. For example, a first color filter 410a of the plurality of color filters 410a-410b may transmit radiation having wavelengths within a first range (e.g., corresponding to green light), while a second color filter 410b of the plurality of color filters 410a-410b may transmit radiation having wavelengths within a second range (e.g., corresponding to red light) different than the first range, etc. A plurality of micro-lenses 412 are arranged over the plurality of color filters 410a-410b. Respective ones of the plurality of micro-lenses 412 are laterally aligned with the plurality of color filters 410a-410b. The plurality of micro-lenses 412 are configured to focus the incident radiation (e.g., light) towards the underlying pixel regions (e.g., pixel region 401).

Figure 4B:
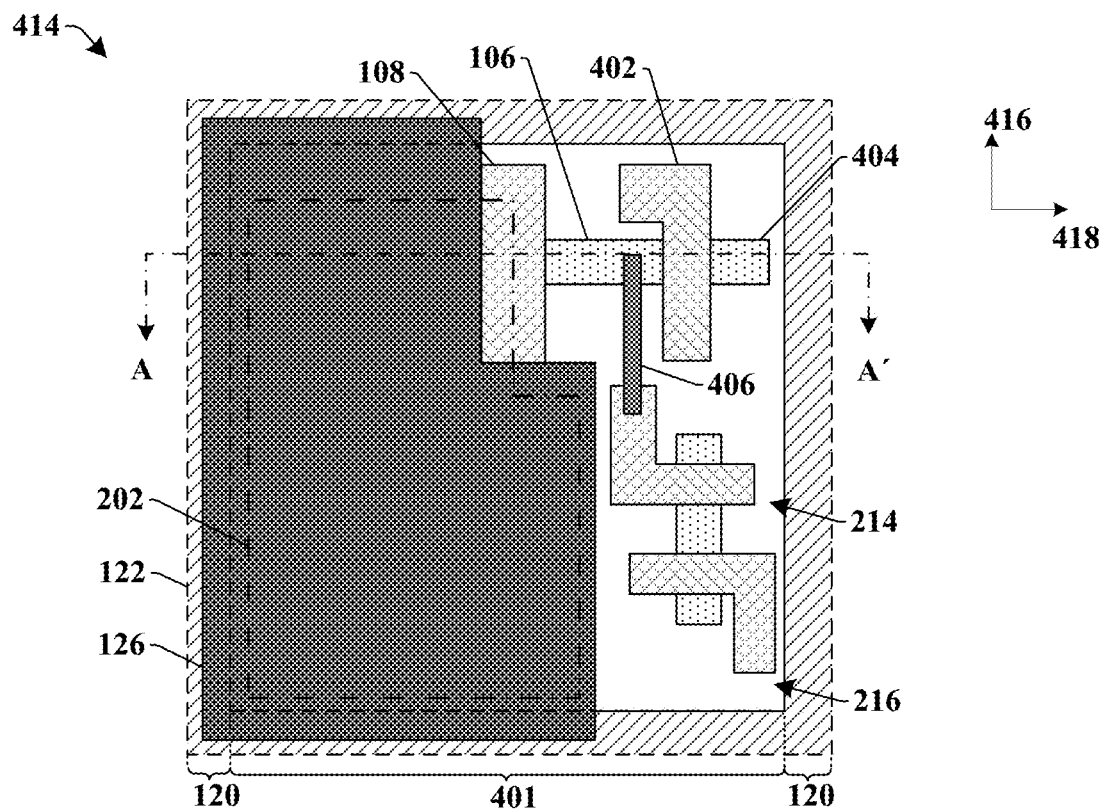

FIG. 4B illustrates a top-view 414 of some embodiments of the integrated image sensor 400 of FIG. 4A. FIG. 4A illustrates the integrated image sensor 400 along cross-sectional line A-A' in top-view 414. It will be appreciated that top-view 414 shows selected components of the integrated image sensor 400 while excluding other components to clarify the figure. Furthermore, although top-view 414 illustrates a single pixel region 401, it will be appreciated that the pixel region 401 may be part of an array of pixel regions.

As shown in top-view 414, the trench 120 extends around the pixel region 401 as a continuous structure. The doped epitaxial material 126 extends from over the first photodiode region 202 to within the trench 120 along a first direction 416 and along a second direction 418. The pixel region 401 comprises the first gate structure 108 associated with the transfer transistor, the second gate structure 402 associated with the reset transistor, a source-follower transistor 214, and a row select transistor 216.

FIG. 5 illustrates a cross-sectional view of some additional alternative embodiments of an integrated image sensor 500 having one or more dielectric materials and a doped epitaxial material arranged within a trench in a substrate.

The integrated image sensor 500 comprises a photodetector 104 disposed within a pixel region 401. The substrate 102 comprises interior surfaces (e.g., sidewalls and a lower surface) defining trenches 120 disposed within a front-side 502f surface of the substrate 102 along opposing sides of the pixel region 401. One or more dielectric materials 122 are disposed within the trench 120. A doped epitaxial material 126 having the second doping type (e.g., a p-type doping) is also disposed within the trench 120. The doped epitaxial material 126 is arranged along opposing sidewalls, 120a and 120b, of the substrate 102 that define the trenches, so that the doped material laterally separates the one or more dielectric materials 122 from both a first sidewall 120a of the substrate 102 and a second sidewall 120b of the substrate 102.

In some embodiments, the integrated image sensor 500 may comprise a back-side illuminated (BSI) sensor. In such embodiments, a grid structure 408 is disposed along a back-side 502b of the substrate 102. A plurality of color filters 410a-410b are arranged within openings in the grid structure 408, and a plurality of micro-lenses 412 are separated from the substrate 102 by the plurality of color filters 410a-410b.

FIGS. 6-15 illustrate cross-sectional views 600-1500 of some embodiments of a method of forming an integrated image sensor having one or more dielectric materials and a doped epitaxial material arranged within a trench in a substrate. Although the cross-sectional views 600-1500 shown in FIGS. 6-15 are described with reference to a method, it will be appreciated that the structures shown in FIGS. 6-15 are not limited to the method but rather may stand alone separate of the method.

Figure 6:
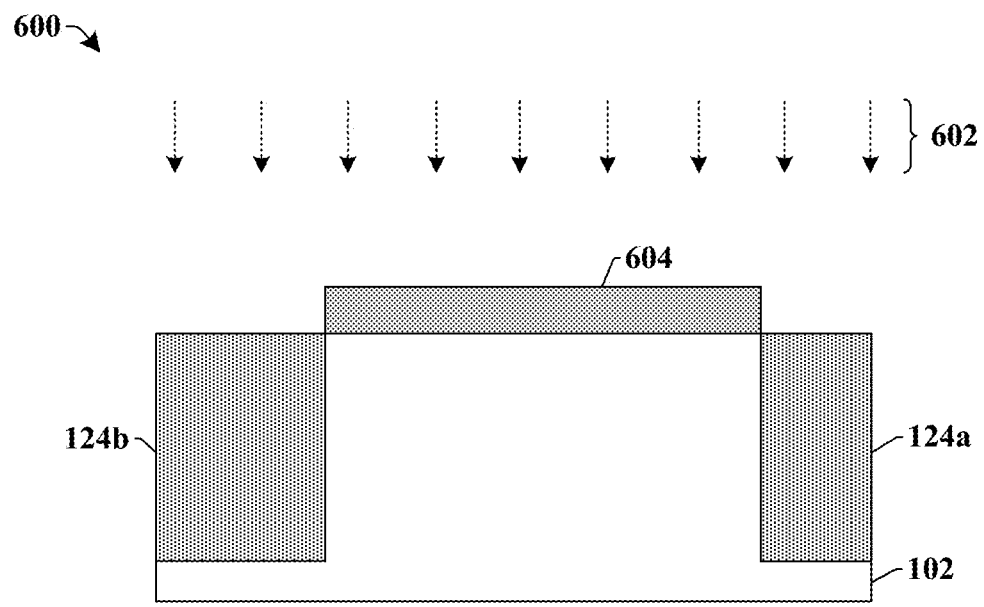
FIGS. 6-15 illustrate cross-sectional views of some embodiments of a method of forming an integrated image sensor having one or more dielectric materials and a doped epitaxial material arranged within a trench in a substrate.

As shown in cross-sectional view 600 of FIG. 6, a first well region 124a and a second well region 124b having a second doping type (e.g., a p-type doping) are formed within a substrate 102 having a first doping type (e.g., an n-type doping). In various embodiments, the substrate 102 may be any type of semiconductor body (e.g., silicon, SiGe, SOI, etc.), as well as any other type of semiconductor, epitaxial, dielectric, and/or metal layers, associated therewith. In some embodiments, the first well region 124a and a second well region 124b may be formed by selectively implanting a dopant species 602 into the substrate 102. In some embodiments, the dopant species 602 may be selectively implanted into the substrate 102 according to a first masking layer 604. In various embodiments, the dopant species may comprise a p-type dopant (e.g., boron, gallium, etc.) or an n-type dopant (e.g., phosphorus, arsenic, etc.). In some embodiments, after implanting the dopant species into the substrate 102, a drive-in anneal may be performed to diffuse the dopant species within the substrate 102. In some embodiments, the first well region 124a and the second well region 12b may extend to depths within the substrate 102 that are substantially equal.

Figure 7:
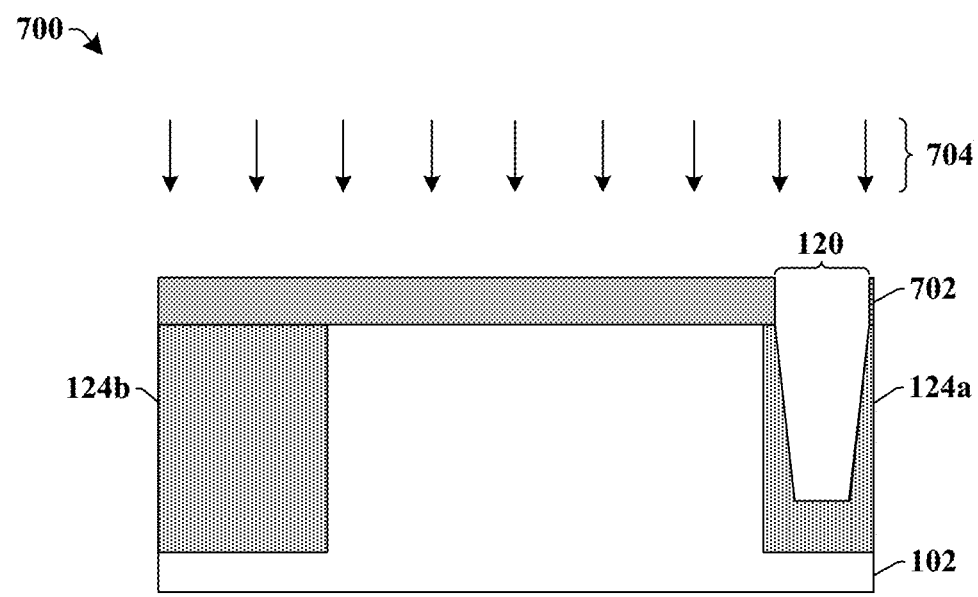

As shown in cross-sectional view 700 of FIG. 7, the substrate 102 is selectively etched to form a trench 120 defined by interior surfaces of the substrate 102 within the first well region 124a. In some embodiments, the substrate 102 may be selectively etched by forming a second masking layer 702 over the substrate 102, and subsequently exposing the substrate 102 to a first etchant 704 configured to form the one or more trench 120 by selectively removing unmasked parts of the substrate 102). In various embodiments, the first etchant 704 may comprise a dry etchant having an etching chemistry comprising a fluorine species (e.g., $CF_4$, $CHF_3$, $C_4F_8$, etc.) or a wet etchant comprising hydroflouric acid (HF), potassium hydroxide (KOH), or the like. In some embodiments, the second masking layer 702 may be formed over a pad oxide layer arranged along an upper surface of the substrate 102.

Figure 8:
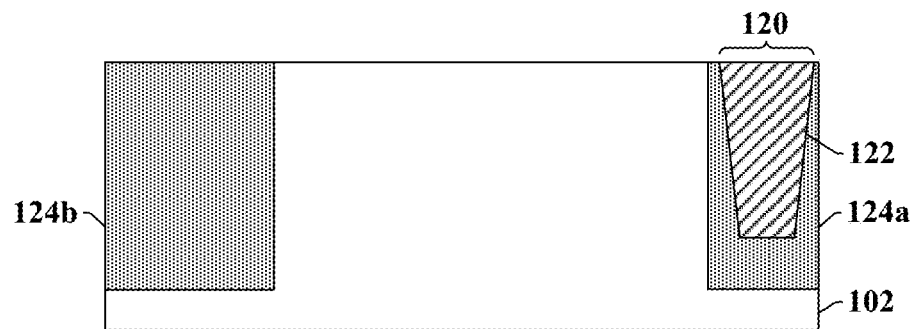

As shown in cross-sectional view 800 of FIG. 8, one or more dielectric materials 122 are formed within the trench 120. In some embodiments, the one or more dielectric materials 122 may comprise an oxide (e.g., silicon oxide), a nitride, a carbide, or the like.

In some embodiments, the one or more dielectric materials 122 may be formed by way of a deposition process (e.g., physical vapor deposition (PVD), chemical vapor deposition (CVD), PE-CVD, atomic layer deposition (ALD), sputtering, etc.). In some embodiments, the one or more dielectric materials may be formed by performing a thermal oxidation process with the second masking layer 702 in place over the substrate 102, followed by a deposition process to fill the trench 120 with the one or more dielectric materials 122. After filling the trench 120 with the one or more dielectric materials 122, a planarization process (e.g., a chemical mechanical planarization process) may be performed to remove the second masking layer 702 and excess of the one or more dielectric materials 122 over the substrate 102.

Figure 9:
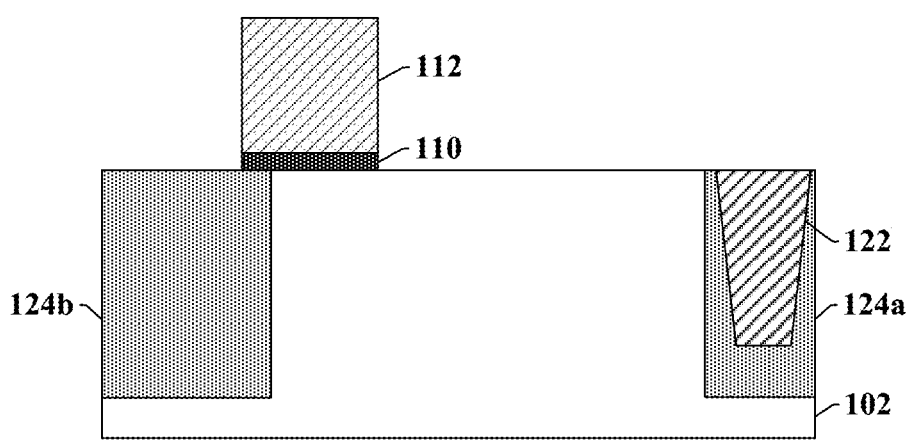

As shown in cross-sectional view 900 of FIG. 9, a gate structure 108 is formed over the substrate 102. The gate structure 108 comprises a conductive gate material 112 separated from the substrate 102 by a gate dielectric layer 110. In some embodiments, the gate structure 108 may be formed by forming a dielectric layer onto the substrate 102, and subsequently forming a conductive material over the dielectric layer. The dielectric layer and the conductive material are subsequently patterned according to a photolithography process to form the gate structure 108.

Figure 10:
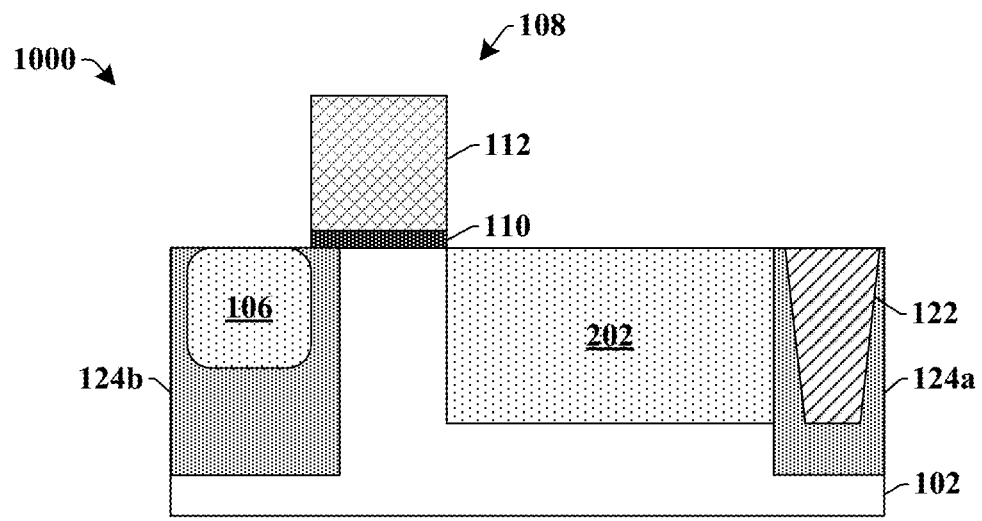

As shown in cross-sectional view 1000 of FIG. 10, a first photodiode region 202 and a floating diffusion region 106 are formed within the substrate 102. The first photodiode region 202 is formed within the substrate 102 at a position separated from the trench 120 by the first well region 124a. In some embodiments, the first photodiode region 202 may contact the first well region 124a. The first photodiode region 202 is formed within the second well region 124b. In some embodiments, the first photodiode region 202 may have the first doping type that is the same as the doping type of the substrate 102, but at a higher doping concentration than that of the substrate 102. In some embodiments, the floating diffusion region 106 may have the first doping type, but at a higher doping concentration than that of the first photodiode region 202.

In some embodiments, the first photodiode region 202 and the floating diffusion region 106 may be formed by selectively implanting the substrate 102 with dopant species (e.g., boron) according to one or more patterned masking layers (not shown) comprising photoresist. In some embodiments, the first photodiode region 202 is formed using a first implantation process at an energy in a range from about 35 KeV to about 200 KeV, and at a dose in a range from about from about $5 \times 10^{14}$ atoms/cm$^3$ to about $1 \times 10^{18}$ atoms/cm$^3$. In some embodiments, the floating diffusion region 106 is formed using a second implantation process having a higher dose than that of the first implantation process.

Figure 11:
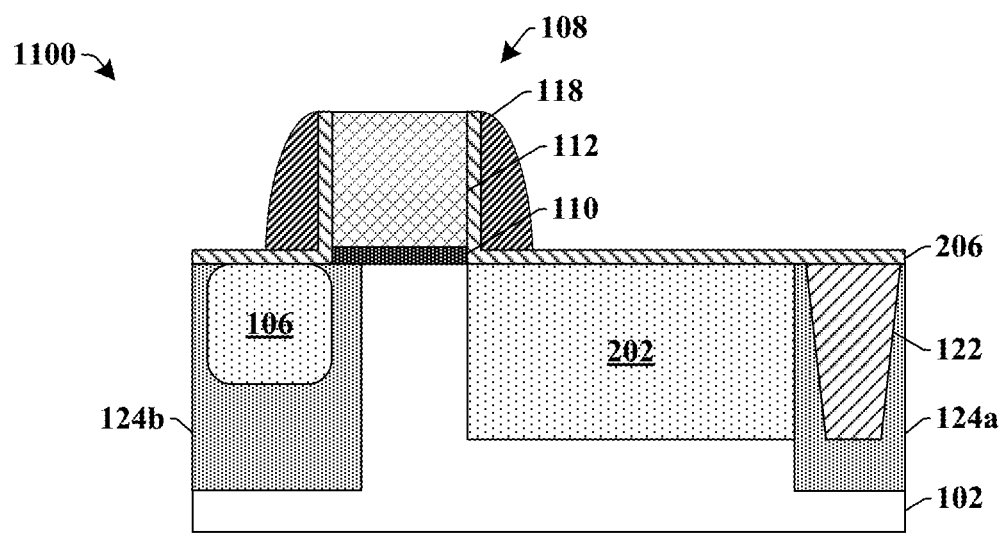

As shown in cross-sectional view 1100 of FIG. 11, a dielectric protection layer 206 is formed over the substrate 102 and along sidewalls of the gate structure 108. In various embodiments, the dielectric protection layer 206 may comprise an oxide, a nitride, a carbide, or the like. The dielectric protection layer 206 may have a thickness in a range about 1 nm to about 100 nm. In various embodiments, the dielectric protection layer 206 may be formed by using a rapid oxidation process, a low pressure chemical vapor deposition (LPCVD) process, or a plasma enhanced chemical vapor deposition (PECVD) process.

In some embodiments, sidewall spacers 118 are formed over the dielectric protection layer 206. The sidewall spacers 118 may be formed by depositing a spacer layer over the substrate 102 and the gate structure 108. In some embodiments, the spacer layer may be deposited by a deposition technique (e.g., PVD, CVD, PE-CVD, ALD, sputtering, etc.) to a thickness in a range of between approximately 400 angstroms and approximately 600 angstroms. The spacer layer is subsequently etched to remove the spacer layer from horizontal surfaces, leaving the spacer layer along opposing sides of gate structure 108, as the sidewall spacers 118. In various embodiments, the spacer layer may comprise silicon nitride, a silicon dioxide ($SiO_2$), silicon oxy-nitride (e.g., SiON), or the like.

Figure 12:
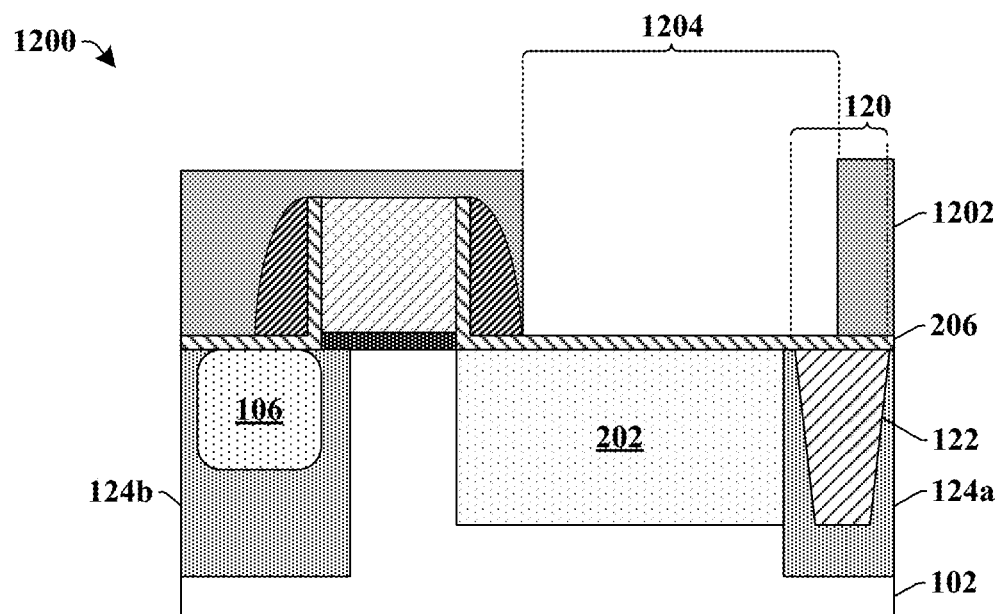

As shown in cross-sectional view 1200 of FIG. 12, a third masking layer 1202 is formed over the substrate 102. The third masking layer 1202 defines an opening 1204 overlying the trench 120 and the first photodiode region 202. In some embodiments, the third masking layer 1202 may comprise a photoresist layer formed by a spin coating process.

Figure 13:
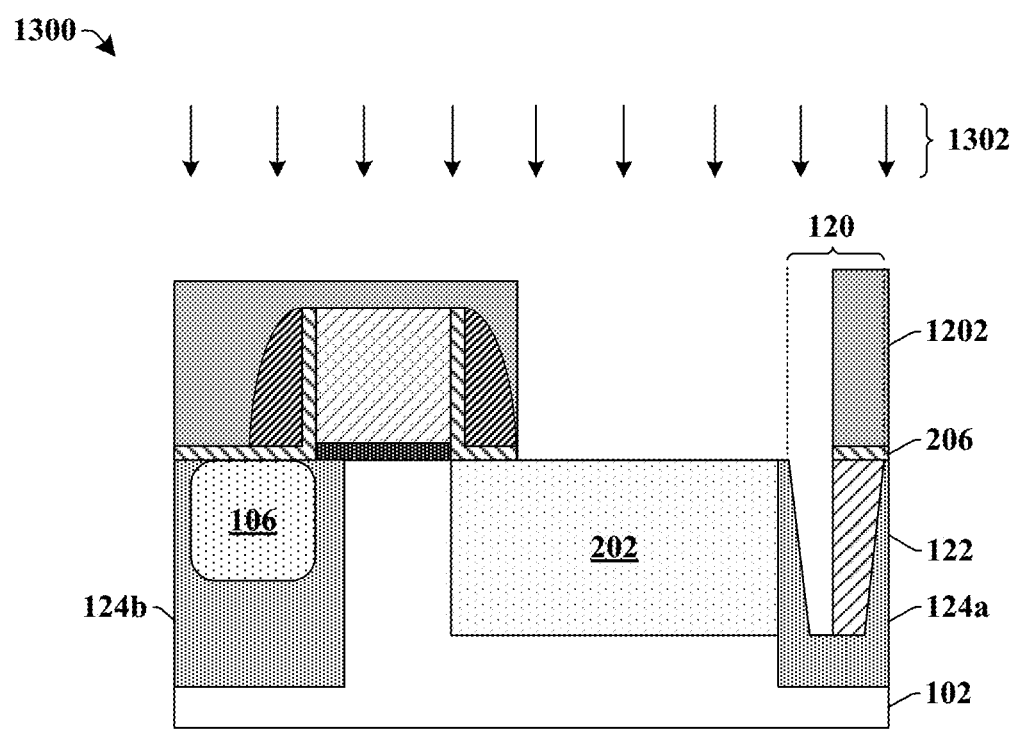

As shown in cross-sectional view 1300 of FIG. 13, an etching process is performed according to the third masking layer 1202. The etching process removes a part of the dielectric protection layer 206 from over the substrate 102 and also removes a part of the one or more dielectric materials 122 from within the trench 120. In some embodiments, the etching process may use a second etchant 1302 comprising a wet etchant, such as hydrofluoric acid (HF), Tetramethylammonium hydroxide (TMAH), potassium hydroxide (KOH), or the like. In other embodiments, the second etchant 1302 may comprise a dry etchant.

Figure 14:
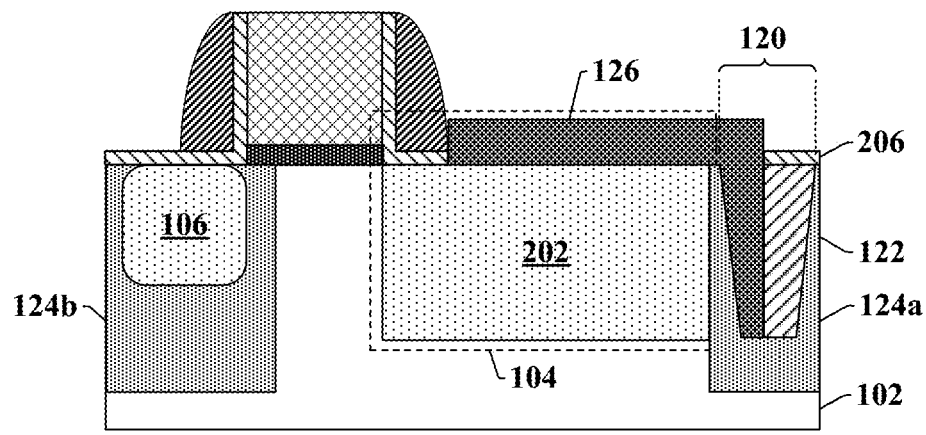

As shown in cross-sectional view 1400 of FIG. 14, a doped epitaxial material 126 is formed within the trench 120. The doped epitaxial material 126 may comprise a doped semiconductor material, such as silicon (e.g., monocrystalline silicon or polysilicon), silicon germanium, indium, or the like. The doped epitaxial material 126 has the second doping type (e.g., the p-type doping) with a higher doping concentration than that of the first well region 124a or the second well region 124b. In some embodiments, the doped epitaxial material 126 may have a doping concentration that is in a range from about $5 \times 10^{15}$ atoms/cm$^3$ to about $1 \times 10^{19}$ atoms/cm$^3$. Because the doping concentration of the doped epitaxial material 126 is higher than that of the first well region 124a, dopants from the doped epitaxial material 126 may diffuse into the first well region 124a to give the first well region 124a a higher doping concentration than the second well region 124b. In some embodiments, the diffusion of dopants from the doped epitaxial material 126 to the first well region 124a may give the first well region 124a a gradient doping concentration that increases from a first concentration near the first photodiode region 202 to a larger, second doping concentration near the trench.

In some embodiments, the doped epitaxial material 126 may also be formed over the first photodiode region 202, so that the doped epitaxial material 126 has a first region over the first photodiode region 202 and a second region within the trench 120. In such embodiments, the first region is configured to act as part of a photodetector 104 and the second region is configured to increase a doping concentration of the first well region 124a near the trench 120 (e.g., by diffusion of dopants from the doped epitaxial material 126 to the first well region 124*a*).

In some embodiments, the doped epitaxial material 126 may be formed using a selective epitaxial growth and an in-situ doping process. The selective epitaxial growth process grows the doped epitaxial material 126 over the substrate 102 at locations not covered by the dielectric protection layer 206.

Figure 15:
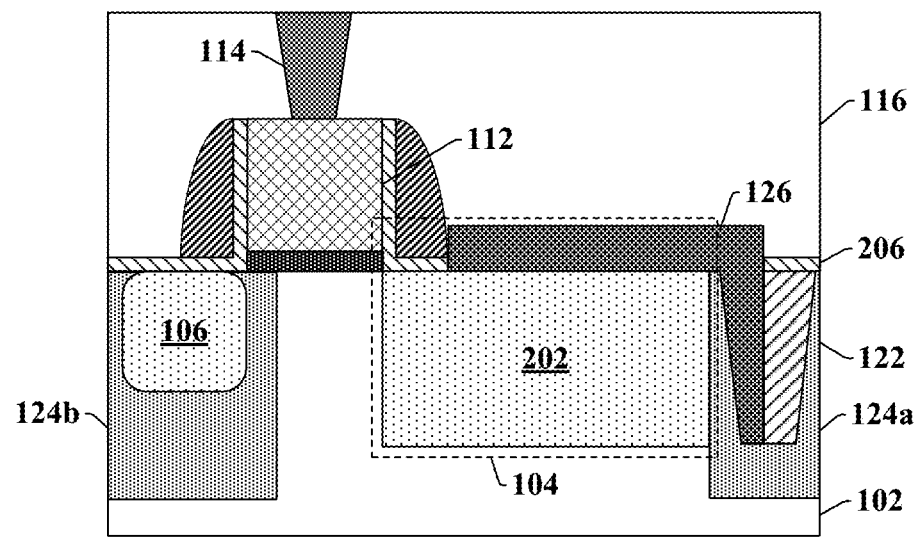

As shown in cross-sectional view 1500 of FIG. 15, a conductive contact 114 is formed within a dielectric structure 116 (e.g., an ILD layer) over the substrate 102. The conductive contact 114 extends through the dielectric structure 116 to contact the conductive gate material 112. In some embodiments, the conductive contact 114 may be formed by way of a damascene process. In such embodiments, the dielectric structure 116 is formed over the substrate 102. The dielectric structure 116 is subsequently etched to form a contact hole, which is filled with a conductive material (e.g., tungsten, copper, and/or aluminum). A chemical mechanical planarization (CMP) process is subsequently performed to remove excess of the conductive material from over the dielectric structure 116.

Figure 16:
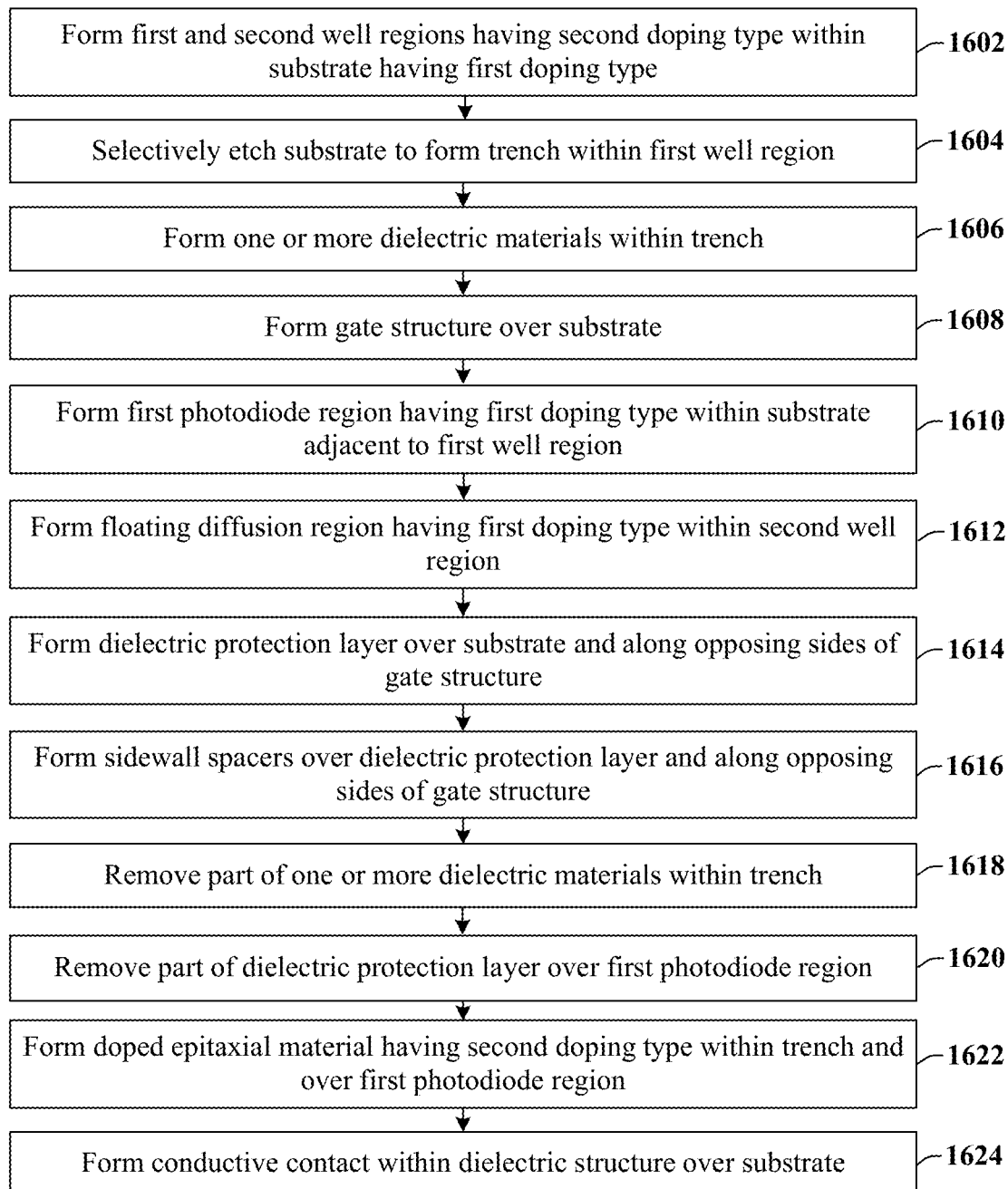
FIG. 16 illustrates a flow diagram of some embodiments of a method of forming an integrated image sensor having one or more dielectric materials and a doped epitaxial material arranged within a trench in a substrate.

FIG. 16 illustrates a flow diagram of some embodiments of a method 1600 of forming an integrated image sensor having one or more dielectric materials and a doped epitaxial material arranged within a trench in a substrate.

While method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, first and second well regions having a second doping type are formed within a substrate having a first doping type. FIG. 6 illustrates a cross-sectional view 600 of some embodiments corresponding to act 1602.

At 1604, the substrate is selectively etched to form a trench within the first well region. FIG. 7 illustrates a cross-sectional view 700 of some embodiments corresponding to act 1604.

At 1606, one or more dielectric materials are formed within the trench. FIG. 8 illustrates a cross-sectional view 800 of some embodiments corresponding to act 1606.

At 1608, a gate structure is formed over the substrate. FIG. 9 illustrates a cross-sectional view 900 of some embodiments corresponding to act 1608.

At 1610, a first photodiode region having the first doping type is formed within the substrate adjacent to the first well region. FIG. 10 illustrates a cross-sectional view 1000 of some embodiments corresponding to act 1610.

At 1612, a floating diffusion region having the first doping type is formed within the second well region. FIG. 10 illustrates a cross-sectional view 1000 of some embodiments corresponding to act 1612.

At 1614, a dielectric protection layer is formed over the substrate and along opposing sides of the gate structure. FIG. 11 illustrates a cross-sectional view 1100 of some embodiments corresponding to act 1614.

At 1616, sidewall spacers are formed over the dielectric protection layer and along opposing sides of the gate structure. FIG. 11 illustrates a cross-sectional view 1100 of some embodiments corresponding to act 1616.

At 1618, a part of the one or more dielectric materials within the trench is removed. FIGS. 12-13 illustrate cross-sectional views 1200-1300 of some embodiments corresponding to act 1618.

At 1620, a part of the dielectric protection layer directly over the first photodiode region is removed. FIGS. 12-13 illustrate cross-sectional views 1200-1300 of some embodiments corresponding to act 1620.

At 1622, a doped epitaxial material having the second doping type is formed within the trench and over the first photodiode region. The doped epitaxial material may comprise a second photodiode region contacting an upper surface of the first photodiode region. FIG. 14 illustrates a cross-sectional view 1400 of some embodiments corresponding to act 1622.

At 1624, a conductive contact is formed within a dielectric structure over the substrate FIG. 15 illustrates a cross-sectional view 1500 of some embodiments corresponding to act 1624.

Accordingly, in some embodiments, the present disclosure relates to an integrated image sensor having an isolation trench comprising one or more dielectric materials and a doped epitaxial material configured to reduce leakage current between adjacent pixel regions.

In some embodiments, the present disclosure relates to an integrated chip. The integrated chip includes a photodetector arranged within a semiconductor substrate having a first doping type; one or more dielectric materials disposed within a trench defined by interior surfaces of the semiconductor substrate; and a doped epitaxial material arranged within the trench at a location laterally between the one or more dielectric materials and the photodetector, the doped epitaxial material has a second doping type that is different than the first doping type. In some embodiments, the integrated chip further includes a first well region disposed within the semiconductor substrate between the trench and the photodetector, the first well region has the second doping type and a smaller doping concentration than that of the doped epitaxial material. In some embodiments, the integrated chip further includes a floating diffusion region disposed within the semiconductor substrate; a gate structure disposed over the semiconductor substrate between the photodetector and the floating diffusion region; and a second well region disposed within the semiconductor substrate and surrounding the floating diffusion region, the second well region has the second doping type and a smaller doping concentration than that of the first well region between the trench and the photodetector. In some embodiments, the doped epitaxial material separates the one or more dielectric materials from a first sidewall of the semiconductor substrate defining the trench; and the one or more dielectric materials separate the doped epitaxial material from a second sidewall of the semiconductor substrate defining the trench. In some embodiments, the doped epitaxial material directly contacts the first sidewall. In some embodiments, the photodetector includes a first photodiode region disposed within the substrate and having the first doping type; and the doped epitaxial material continuously extends from within the trench to directly above the first photodiode region, the doped epitaxial material directly above the first photodiode region defining a second photodiode region. In some embodiments, the doped epitaxial material directly contacts an upper surface of the first photodiode region. In some embodiments, the doped epitaxial material protrudes outward from within the trench to over the semiconductor substrate. In some embodiments, the integrated chip further includes a dielectric protection layer arranged over the one or more dielectric materials within the trench, the dielectric protection layer laterally contacts a sidewall of the doped epitaxial material.

In other embodiments, the present disclosure relates to an integrated chip. The integrated chip includes a substrate having interior surfaces defining a trench; a first well region disposed within the substrate between the trench and a first photodiode region; a floating diffusion region surrounded by a second well region disposed within the substrate; a gate structure arranged over the substrate between the first photodiode region and the floating diffusion region; one or more dielectric materials disposed within the trench; and a doped epitaxial material arranged within the trench between the one or more dielectric materials and the first well region. In some embodiments, the doped epitaxial material separates the one or more dielectric materials from a first sidewall of the substrate defining the trench; and the one or more dielectric materials separate the doped epitaxial material from a second sidewall of the substrate defining the trench. In some embodiments, the doped epitaxial material continuously extends from within the trench to directly contact a top of the first photodiode region. In some embodiments, the doped epitaxial material has a larger doping concentration that of the first well region or the second well region. In some embodiments, the integrated chip further includes sidewall spacers arranged along opposing sides of the gate structure, the doped epitaxial material laterally contacts the sidewall spacers. In some embodiments, the substrate has a first doping type, the first well region and the second well region have a second doping type different than the first doping type, the first photodiode region has the first doping type, and the doped epitaxial material has the second doping type.

In yet other embodiments, the present disclosure relates to a method of forming an integrated chip. The method includes doping a substrate to form a first well region and a second well region having a first doping type, the first well region and the second well region have a second doping type; selectively patterning the substrate to define a trench extending into the first well region; filling the trench with one or more dielectric materials; doping a first photodiode region within the substrate, the first photodiode region is separated from the trench by the first well region; removing a part of the one or more dielectric materials from within the trench; and growing a doped epitaxial material along a sidewall of the trench that is proximate to the first photodiode region. In some embodiments, the method further includes forming a dielectric protection layer over the one or more dielectric materials within the trench; and forming the doped epitaxial material using a selective epitaxial growth process that forms the doped epitaxial material on surfaces not covered by the dielectric protection layer. In some embodiments, the method further includes forming a gate structure over the substrate at a location adjacent to the first photodiode region; and forming sidewall spacers along opposing sides of the gate structure, the dielectric protection layer extends between the substrate and the sidewall spacers. In some embodiments, the doped epitaxial material has a larger doping concentration than that of the first well region and the second well region. In some embodiments, the method further includes forming a floating diffusion region within the second well region; and forming a gate structure over the substrate between the floating diffusion region and the first photodiode region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a photodetector arranged within a semiconductor substrate having a first doping type;
   one or more dielectric materials disposed within a trench defined by interior surfaces of the semiconductor substrate;
   a doped epitaxial material arranged within the trench at a location laterally between the one or more dielectric materials and the photodetector, wherein the doped epitaxial material has a second doping type that is different than the first doping type; and
   wherein the doped epitaxial material protrudes outward from within the trench to over the semiconductor substrate.

2. The integrated chip of claim 1, further comprising:
   a first well region disposed within the semiconductor substrate between the trench and the photodetector, wherein the first well region has the second doping type and a smaller doping concentration than that of the doped epitaxial material.

3. The integrated chip of claim 2, further comprising:
   a floating diffusion region disposed within the semiconductor substrate;
   a gate structure disposed over the semiconductor substrate between the photodetector and the floating diffusion region; and
   a second well region disposed within the semiconductor substrate and surrounding the floating diffusion region, wherein the second well region has the second doping type and a smaller doping concentration than that of the first well region between the trench and the photodetector.

4. The integrated chip of claim 1,
   wherein the doped epitaxial material separates the one or more dielectric materials from a first sidewall of the semiconductor substrate defining the trench; and
   wherein the one or more dielectric materials separate the doped epitaxial material from a second sidewall of the semiconductor substrate defining the trench.

5. The integrated chip of claim 4, wherein the doped epitaxial material directly contacts the first sidewall.

6. The integrated chip of claim 1,
   wherein the photodetector comprises a first region disposed within the semiconductor substrate and having the first doping type;
   wherein the doped epitaxial material continuously extends from within the trench to directly above the first region; and
   wherein the doped epitaxial material that is directly above the first region defines a second region of the photodetector.

7. The integrated chip of claim 6, wherein the doped epitaxial material directly contacts an upper surface of the first region.

8. The integrated chip of claim 1, further comprising:
a dielectric protection layer arranged over the one or more dielectric materials within the trench, wherein the dielectric protection layer laterally contacts a sidewall of the doped epitaxial material.

9. The integrated chip of claim 1, wherein the doped epitaxial material extends from a bottom of the trench to over the semiconductor substrate.

10. An integrated chip, comprising:
a substrate having interior surfaces defining a trench;
a first well region disposed within the substrate between the trench and a first photodiode region;
a floating diffusion region surrounded by a second well region disposed within the substrate;
a gate structure arranged over the substrate between the first photodiode region and the floating diffusion region;
one or more dielectric materials disposed within the trench; and
a doped epitaxial material arranged within the trench between the one or more dielectric materials and the first well region.

11. The integrated chip of claim 10, wherein the first well region has a doping concentration that is in a range of between approximately $1 \times 10^{15}$ atoms/cm$^3$ and approximately $1 \times 10^{17}$ atoms/cm$^3$.

12. The integrated chip of claim 10, wherein the doped epitaxial material continuously extends from within the trench to directly contact a top of the first photodiode region.

13. The integrated chip of claim 10, wherein the doped epitaxial material has a larger doping concentration than that of the first well region or the second well region.

14. The integrated chip of claim 10, further comprising:
sidewall spacers arranged along opposing sides of the gate structure, wherein the doped epitaxial material laterally contacts the sidewall spacers.

15. The integrated chip of claim 10, wherein the substrate has a first doping type, the first well region and the second well region have a second doping type different than the first doping type, the first photodiode region has the first doping type, and the doped epitaxial material has the second doping type.

16. An integrated chip, comprising:
an image sensing element arranged within a substrate;
a gate electrode disposed over an upper surface of the substrate;
one or more dielectric materials disposed within a trench defined by interior surfaces of the substrate; and
a doped epitaxial material arranged within the trench at a location laterally between the one or more dielectric materials and the image sensing element, wherein the doped epitaxial material continuously extends from within the trench to a position directly over the upper surface of the substrate.

17. The integrated chip of claim 16, further comprising:
one or more sidewall spacers disposed along sidewalls of the gate electrode; and
a dielectric protection layer separating the one or more sidewall spacers from the gate electrode, wherein the doped epitaxial material laterally contacts the dielectric protection layer.

18. The integrated chip of claim 16, wherein the doped epitaxial material has a lower surface directly over the image sensing element.

19. The integrated chip of claim 16, wherein the doped epitaxial material directly contacts a horizontally extending surface of the substrate that defines a bottom of the trench.

20. The integrated chip of claim 16, wherein the doped epitaxial material directly contacts a sidewall of the substrate defining the trench.

* * * * *